United States Patent
Mu et al.

(10) Patent No.: US 8,902,667 B2
(45) Date of Patent: Dec. 2, 2014

(54) METHODS AND SYSTEMS FOR ADJUSTING NVM CELL BIAS CONDITIONS FOR PROGRAM/ERASE OPERATIONS TO REDUCE PERFORMANCE DEGRADATION

(75) Inventors: Fuchen Mu, Austin, TX (US); Yanzhuo Wang, Austin, TX (US); Chen He, Austin, TX (US); Richard K. Eguchi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 198 days.

(21) Appl. No.: 13/557,629

(22) Filed: Jul. 25, 2012

(65) Prior Publication Data
US 2014/0029351 A1  Jan. 30, 2014

(51) Int. Cl.
*G11C 11/34* (2006.01)

(52) U.S. Cl.
USPC ............ 365/185.22; 365/185.19; 365/185.03; 365/185.18

(58) Field of Classification Search
CPC ............................ G11C 16/24; G11C 13/0064
USPC ............ 365/185.22, 185.18, 185.27, 185.03, 365/185.24, 185.19
See application file for complete search history.

(56) References Cited

U.S. PATENT DOCUMENTS

| | | | |
|---|---|---|---|
| 5,991,201 A | 11/1999 | Kuo et al. | 365/185.19 |
| 6,944,077 B2 | 9/2005 | Morikawa | 365/204 |
| 7,079,424 B1 | 7/2006 | Lee et al. | 365/185.29 |
| 7,173,859 B2 | 2/2007 | Hemink | 365/185.28 |
| 7,177,199 B2 | 2/2007 | Chen et al. | 365/185.28 |
| 7,224,617 B2 | 5/2007 | Takeuchi | |
| 7,580,288 B2 * | 8/2009 | Choy et al. | 365/185.18 |
| 7,633,807 B2 * | 12/2009 | Chen et al. | 365/185.24 |
| 7,715,237 B2 | 5/2010 | Cohen | 365/185.2 |
| 7,733,700 B2 | 6/2010 | Wang | 365/185.18 |
| 7,864,588 B2 | 1/2011 | Betser et al. | 365/185.2 |
| 7,877,542 B2 | 1/2011 | Chow et al. | 711/103 |
| 8,087,787 B2 | 1/2012 | Medin | 353/52 |
| 8,102,713 B2 | 1/2012 | Teggatz et al. | 365/185.18 |
| 2003/0147278 A1 * | 8/2003 | Tanaka et al. | 365/185.03 |
| 2004/0145947 A1 * | 7/2004 | Micheloni et al. | 365/185.19 |
| 2007/0171726 A1 | 7/2007 | Kang et al. | |
| 2007/0183210 A1 * | 8/2007 | Choi et al. | 365/185.22 |
| 2007/0195603 A1 | 8/2007 | Aritome et al. | |
| 2008/0117688 A1 * | 5/2008 | Park et al. | 365/185.22 |
| 2008/0159007 A1 | 7/2008 | Sekar et al. | |
| 2010/0074028 A1 | 3/2010 | Hirose et al. | |
| 2011/0182119 A1 | 7/2011 | Strasser et al. | |
| 2014/0029350 A1 * | 1/2014 | Mu et al. | 365/185.22 |

OTHER PUBLICATIONS

Foreign Search Report, Application No. 13177161.0, Nov. 18, 2013, 6 pgs.

(Continued)

*Primary Examiner* — Toan Le
*Assistant Examiner* — Ajay Ojha
(74) *Attorney, Agent, or Firm* — Egan, Peterman, Enders LLP.

(57) ABSTRACT

Non-volatile memory (NVM) systems and related methods adjust program/erase bias conditions for non-volatile memory (NVM) cells to improve performance and product lifetime of NVM systems. System embodiments include integrated NVM systems having an NVM controller, a bias voltage generator, and an NVM cell array. Further, the NVM systems can store performance degradation information and program/erase bias condition information within storage circuitry. The disclosed embodiments adjust program/erase bias conditions for the NVM cells based upon performance degradation determinations, for example, temperature-based performance degradation determinations and interim verify based performance degradation determinations.

20 Claims, 6 Drawing Sheets

(56) References Cited

OTHER PUBLICATIONS

Mu et al., "Methods and Systems for Adjusting NVM Cell Bias Conditions Based Upon Operating Temperature to Reduce Performance Degradation", U.S. Appl. No. 13/557,481, filed Jul. 25, 2012, 20 pgs.

Mu et al., "Methods and Systems for Adjusting NVM Cell Bias Conditions for Read/Verify Operations to Compensate for Performance Degradation", U.S. Appl. No. 13/557,449, filed Jul. 25, 2012, 25 pgs.

Stephen Ledford, "Non-Volatile Memory Technology Overview," Freescale Semiconductor, AN1837, 2004, 28 pgs.

U.S. Appl. No. 13/169,989, "Adaptive Write Procedures for Non-Volatile Memory Using Verify Read," filed Jun. 27, 2011, 29 pgs.

Choy et al., U.S. Appl. No. 13/023,713, "Erase Ramp Pulse Width Control for Non-Volatile Memory," filed Feb. 9, 2011, 27 pgs.

European Search Report, Aug. 26, 2014, 13 pgs.

* cited by examiner

METHODS AND SYSTEMS FOR ADJUSTING NVM CELL BIAS CONDITIONS FOR PROGRAM/ERASE OPERATIONS TO REDUCE PERFORMANCE DEGRADATION

RELATED APPLICATIONS

This application is related in subject matter to the following concurrently filed applications: U.S. patent application Ser. No. 13/557,449, entitled "METHODS AND SYSTEMS FOR ADJUSTING NVM CELL BIAS CONDITIONS FOR READ/VERIFY OPERATIONS TO COMPENSATE FOR PERFORMANCE DEGRADATION," and U.S. patent application Ser. No. 13/557,481, entitled "METHODS AND SYSTEMS FOR ADJUSTING NVM CELL BIAS CONDITIONS BASED UPON OPERATING TEMPERATURE TO REDUCE PERFORMANCE DEGRADATION," and which are each hereby incorporated by reference in its entirety.

TECHNICAL FIELD

This technical field relates to non-volatile memories (NVMs) and, more particularly, to techniques for controlling memory operations for NVM cells.

BACKGROUND

Programmable memories have been implemented using non-volatile memory (NVM) cells. These NVM systems can be implemented as stand-alone memory integrated circuits or can be embedded within other integrated circuits. NVM systems have utilized a variety of cell structures for NVM cells, including floating gate cells and split-gate cells. Further, a variety of techniques have been used to perform read, program, and erase operations for NVM cells, including Fowler-Nordheim (FN) tunneling techniques. The performance of NVM cells can degrade, however, due to a variety of factors.

Program/erase performance for NVM cells, for example, is temperature dependent. In particular, the speed of program operations is slower at higher temperature than that at lower temperature. Fowler-Nordheim (FN) tunneling erase operations are faster at high temperature than that at lower temperature. These temperature variations are natural behaviors based on physical properties. These temperature dependent behaviors can lead to performance degradation. For example, a voltage ramp is often used in FN erase and soft-program operations. For the slow erase operations at lower temperatures, the time needed for the erase operation can run over the voltage ramp timing, thereby leading to dramatically degraded cycling performance.

Program/erase performance for NVM cells will also degrade dramatically after a certain number of program/erase cycles because of the accumulation of the damage due to cycling. For example, for NVM cells that utilize floating gates and tunneling oxides, more and more charges (e.g., holes and electrons) are trapped within tunnel oxide as cycle count increases, thereby damaging the tunnel oxide. This damage not only degrades program/erase performance, but it also degrades other reliability aspects for the NVM cells due to large de-trapping effects. Some of these reliability aspects include data retention bake (DRB) reliability, operating life (OL), program disturb, read disturb, and other reliability aspects for the NVM cells.

Performance degradations for the NVM cells, such as performance degradations due to temperature variations or high cycle counts, can reduce the useful lifetime for the NVM systems and integrated circuits within which these NVM systems are embedded.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for adjusting program/erase bias conditions for non-volatile memory (NVM) cells to improve performance and product lifetime of NVM systems. In particular, embodiments are disclosed for adjusting NVM cell bias conditions for program/erase operations based upon performance degradation determinations including temperature-based performance degradation determinations and interim program/erase verify performance degradation determinations. The disclosed embodiments maintain high performance even as performance degradation occurs, for example, due to device aging from high cycle counts, thereby improving product reliability and extending product lifetime. The various embodiments disclosed can be used alone or in combination with each other, as desired. Further, additional or different features and variations can be implemented, as desired, and related or modified systems and methods can be utilized, as well.

Figure 1:
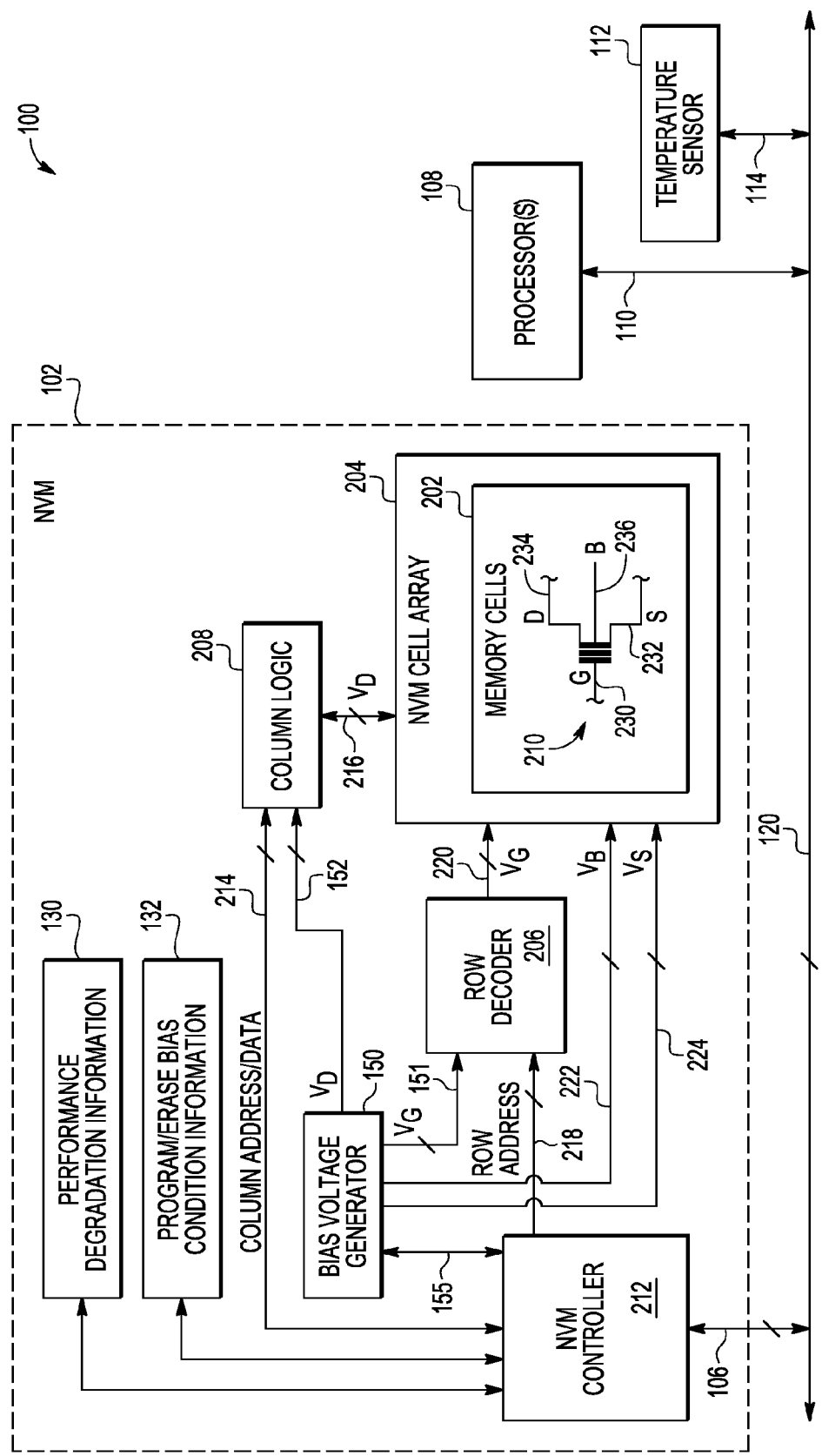
FIG. 1 is a block diagram of an embodiment including an non-volatile memory (NVM) system.
Figure 2:
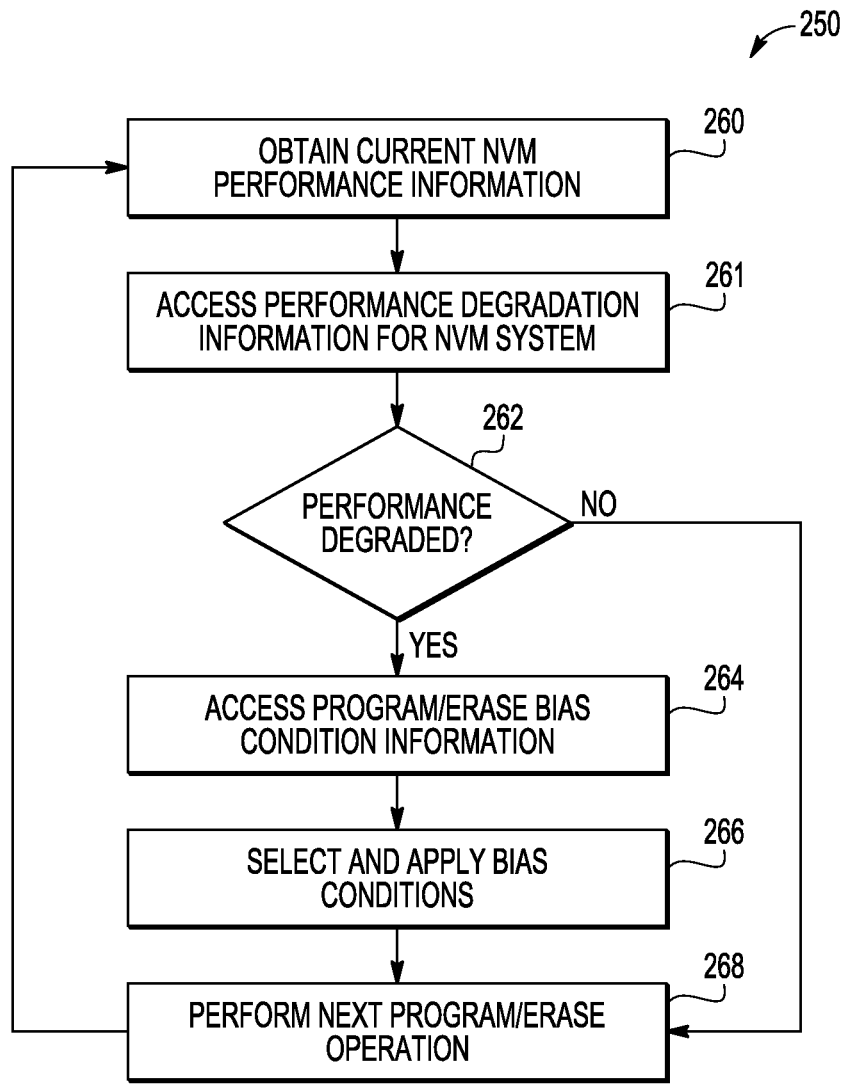
FIG. 2 is a flow diagram of an embodiment for adjusting operating bias conditions for the NVM system when performance degradation has been detected.
Figure 3:
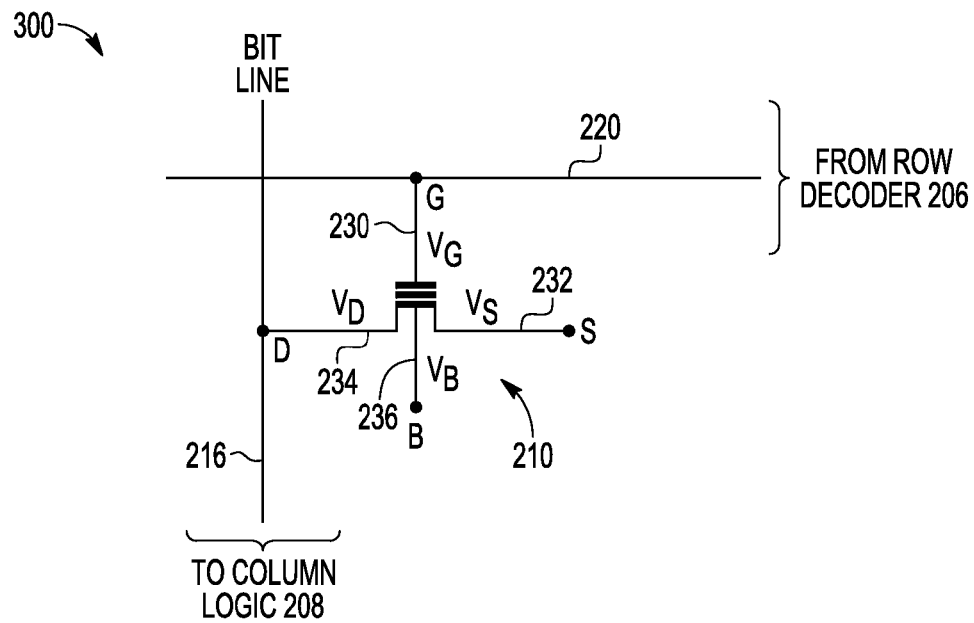
FIG. 3 is a diagram for wordline and bit-line connections to an NVM memory cell.

First, looking to FIGS. 1-3, example embodiments are described for adjusting program and/or erase bias conditions for NVM cells to improve performance and product lifetime of NVM systems. These embodiments use current performance information, stored performance degradation information, and/or stored bias condition information to implement adjustments to NVM cell bias conditions for program and/or erase memory operations in order to improve performance of the NVM system.

FIG. 1 is a block diagram of an embodiment 100 including an non-volatile memory (NVM) system 102 along with additional circuitry, such as one or more processors 108. The NVM system 102 is configured to store operational data that is utilized in operating the NVM system 102. For example, for the embodiment 100 depicted, the NVM system 102 includes performance degradation information 130 and/or program/erase bias condition information 132 that can be used for memory operations within the NVM system 102, as described in further detail below. This performance degradation information 130 and program/erase bias condition information 132 can be stored within storage circuitry located within the NVM system 102, and this storage circuitry can be, for example, random access memory (RAM), read-only memory (ROM), programmable non-volatile memory (NVM), or other desired storage circuitry. Still further, for the embodiment 100 depicted, the NVM system 102 and the processor(s) 108 are coupled to a communication bus 120 through connections 106 and 110, respectively. Additional circuitry blocks can also be included within the embodiment 100, as desired. For example, an on-chip temperature sensor 112 can be provided, and the temperature sensor 112 can be coupled to communication bus 120 through connections 114. The temperature sensor 112 can generate temperature measurements corresponding to the operating temperature for the NVM system 102. These temperature measurements can be accessed by or communicated to the processor(s) 108, the NVM system 102, and/or other circuitry, as desired. It is noted that the NVM system 102 can be integrated within a single integrated circuit with the one or more processors 108 or can be implemented as stand-alone memory integrated circuit, if desired. Further, it is noted that the temperature sensor 112 could be integrated with the NVM system 102 or could be integrated within another integrated circuit, if desired. Still further, it is noted that the circuitry for the NVM system 102 could be implemented using multiple integrated circuits, if desired.

The NVM system 102 includes an array 204 of NVM cells 202. The NVM system 102 also includes an NVM controller 212, a row decoder 206, and column decoder logic 208. As indicated above, the NVM system 102 is configured to store operational data, such as performance degradation information 130 and/or program/erase bias condition information 132, that can be used for one or more operations of the NVM system 102. Memory cell 210 represents one of the plurality of NVM memory cells 202. For the embodiment depicted, memory cell 210 is a floating-gate type NVM memory cell having a gate (G) connection 230, a source (S) connection 232, a drain (D) connection 234, and a body (B) connection 236. It is noted that other NVM cell types could also be utilized, if desired. For example, split-gate NVM cells or multi-level NVM cells could be used, or other NVM cells could be used, if desired.

The performance degradation information 130, as described herein, is used to determine when the NVM system 102 is experiencing degraded performance, for example, due to temperature variations, due to high cycle counts (e.g., due to long term use), due to longer pulse counts being required for program or erase operations, due to interim program verify failures, due to interim erase verify failures, and/or due to other detected operational events for the NVM system 102. As described further below, once performance degradation has been detected, the controller 212 can change the program and/or erase bias conditions from a current set of bias conditions (e.g., default bias conditions) to a new set of bias conditions selected from the program/erase bias condition information 132 in order to improve product performance and extend product lifetime.

The stored program/erase bias condition information 132, as described herein, is used to provide different sets of selectable bias condition parameters for program and/or erase operations for the NVM system 102. These sets of selectable bias condition parameters can include, for example, default bias conditions and one or more additional sets of bias conditions that can be selected based upon operating conditions, such after detection of degraded performance or some other condition or parameter, as desired.

During operation, the NVM controller 212 provides row addresses to the row decoder 206 through connection 218. The row decoder 206 drives selected wordlines with gate bias voltages ($V_G$) 220 applied to gate nodes 230 for selected row(s) of NVM cells 202 within the NVM cell array 204. The NVM controller 212 also provides column addresses to column logic 208 through connections 214. The column logic 208 drives selected bit-lines with drain bias voltages ($V_D$) 216 applied to drain nodes 234 for selected column(s) of NVM cells 202. The column logic 208 is also used to access and read stored data values from the selected NVM cells 202 within the NVM cell array 204 through connections 216.

A bias voltage generator 150 is configured to generate a variety of bias voltages that are used for the operation of the NVM system 102. For example, the bias voltage generator 150 provides gate bias voltages 151 to row decoder 206 that are used to apply the gate bias voltages ($V_G$) 220 to the NVM cells 202 within the NVM cell array 204. The bias voltage generator 150 also provides drain bias voltages 152 to column logic 208 that are used to apply the drain bias voltages ($V_D$) 216 to the NVM cells 202 within the NVM cell array 204. Further, the bias voltage generator 150 provides body bias voltages ($V_B$) 222 to body nodes 236 for the NVM cells 202 within the NVM cell array 204, and the bias voltage generator 150 provides source bias voltages ($V_S$) 224 to source nodes 232 for the NVM cells 202 within the NVM cell array 204. The bias voltage generator 150 receives bias control signals 155 from the NVM controller 212 that control which bias voltages are provided by the bias voltage generator and used by the row decoder 206, the column logic 208, and the NVM cell array 204. It is further noted that the bias voltage generator 150 can be implemented as bias voltage generator circuitry that is distributed in different locations throughout the NVM system 102, if desired. For example, where the NVM system 102 is integrated within an integrated circuit, the bias voltage generator circuitry can be implemented as different circuit blocks positioned in different locations within the integrated circuit, and the different circuit blocks can be configured to generate one or more of the bias voltages. Further, if desired, the bias voltage generator circuitry can be implemented as a single, non-distributed circuit block. Other variations could also be implemented as desired while still provide the bias voltages described herein.

As indicated above, the NVM system 102 is configured to perform one or more operations, such as a read operation, an erase operation, a program operation, a soft-program operation, an erase verify operation, a program verify operation, a soft-program verify operation, and/or any other desired operation. Typically, when put into operation after manufacture, an erase operation is first performed to clear any information stored within the NVM system 102. Following an erase operation, a soft-program operation can be used to make sure that the erased NVM cells are not excessively depleted. Next, a program operation is performed to access selected NVM cells and to write desired data into the NVM system 102. Subsequently, read operations are used to access the data stored within the NVM system 102. If it is desired to modify the data stored in the NVM system 102, additional erase and program operations can be used to modify the data within the NVM system 102. Program/erase cycling and read operations are often continued throughout the useful life of the NVM system 102.

For a read operation, the data from the accessed NVM cells 202 is read by the column logic 208 and transmitted back to the NVM controller 212 through connections 214. The NVM controller 212 can then provide this read data to external circuitry through connections 106. For a program operation, the accessed memory cells are programmed with data provided by the NVM controller 212, which can in turn be provided from external circuitry through the connections 106. For an erase operation, the threshold voltage of the accessed memory cells is reduced to below a desired threshold (i.e., erase verify level) after the erase operation. For a soft-program operation, as indicated above, the threshold voltage of the accessed memory cells is increased to above a desired threshold (i.e., soft program verify level) after the soft program operation. Verify operations (e.g., erase verify, program verify, soft-program verify) are a type of read operation where the stored charge within NVM cells is interrogated by accessing the cells and compared against selected threshold voltages or currents.

It is further noted that for program and erase operations, charge is added to or removed from charge storage layers within the NVM cells 202. These charge storage layers can be, for example, floating gates or discrete charge layers within the NVM cells 202. More particularly, when an NVM cell 202 is programmed, electrons are added to the charge storage layer (e.g., thereby generating a higher threshold voltage when read). When the NVM cell 202 is erased, electrons are removed from the charge storage layer (e.g., thereby generating a lower threshold voltage when read). If desired, the NVM system 102 can be configured to operate with a weaker erase, such that after erase, a small negative charge is still left in the charge storage layer. Also, the NVM system 102 may be configured to have a very strong erase, such that the charge storage layer is over-erased, generating net holes within the storage layer and thereby providing a positive charge within the erased cell. When an NVM cell 202 is later accessed during a read operation, a determination is made as to whether the threshold voltage of the cell is greater than a read voltage level (e.g., logic "0") or less than a read voltage level (e.g., logic "1"). It is also noted that where multi-level NVM cells are utilized within the NVM system, a determination is made as to what logic values the threshold voltage of the cell represents. For example, for a four level cell, the detected logic levels are "00," "01," "10," and "11" with a single cell storing two bits of information.

FIG. 2 is a flow diagram of an embodiment 250 for adjusting operating bias conditions for the NVM system 102 when performance degradation has been detected. In block 260, current NVM performance information is obtained. This performance information can include operating temperature measurements, a count of the number of program/erase cycles the NVM system 102 has experienced (i.e., cycle count), a count of the number of pulses required for a successful erase or program operation (i.e., pulse count), interim program verify results, interim erase verify results, and/or other desired performance information for the NVM system 102. A successful erase or program operation is typically considered to have occurred when all erased or programmed NVM cells satisfy erase verify and program (e.g., program, soft-program) verify voltage levels. Next, in block 261 performance degradation information is accessed for the NVM system. This performance degradation information can include selected information used to determine when degradation has occurred or may occur associated with operations for the NVM system 102. As indicated above, the performance degradation information can include temperature information, cycle count information, erase or program pulse count information, interim program/erase verify information, and/or any other desired performance degradation information.

Determination block 262 then compares the current NVM performance information with the performance degradation information to make a determination of whether or not the performance of the NVM system 102 is degraded. If NO, then flow passes to block 268 where the next NVM operation is performed. If YES, then flow passes to block 264, where the program/erase bias condition information is accessed. As indicated above, the bias condition information can include different sets of bias condition parameters that may be used for performing program and/or erase operations. These different sets of program/erase bias condition parameters can include, for example, a set of default bias conditions and one or more sets of additional bias conditions. The sets of additional bias conditions can provide bias conditions configured to respond to performance degradation determinations, thereby improving performance of the NVM system 102. In block 266, bias conditions are selected from the bias condition information, and these selected bias conditions are applied to the NVM system 102. Finally, in block 268, the next program/erase NVM operation is performed. It is noted that where a set of default bias conditions and a single set of additional bias conditions are utilized, blocks 264 and 266 can be simplified such that the bias condition parameters being adjusted are simply switched from the default to the non-default bias conditions when performance degradation has been detected.

It is again noted that NVM system 102 is typically configured to perform one or more operations, such as a read operation, an erase operation, a program operation, a soft-program operation, an erase verify operation, a program verify operation, a soft-program verify operation, and/or any other desired operation. During these operations, bias conditions are applied to the NVM cells 202 within the NVM system 102, and these bias conditions depend upon the NVM operation being performed.

FIG. 3 is a diagram of an embodiment 300 for wordline and bit-line connections to an NVM memory cell 210. During an operation, the NVM memory cell 210 has its body (B) 236 connected to a body bias voltage ($V_B$) and has its source (S) 232 connect to a source bias voltage ($V_S$), for example, as provided by the bias voltage generator 150 as described above. The NVM cell 210 has its drain (D) 234 coupled to the column logic 208 through one of the connections 216 to receive a drain bias voltage ($V_D$). The NVM cell 210 has its gate (G) 230 coupled to the row decoder 206 through one of the connections 220 to receive a gate bias voltage ($V_G$). Depending upon the operation to be performed for the NVM memory cells 202, different body, source, drain, and gate bias voltages ($V_B$, $V_S$, $V_D$, $V_G$) are applied to the body (B) nodes 236, source (S) nodes 232, drain (D) nodes 234, and gate (G) nodes 230 for selected NVM memory cells 202.

TABLE 1 below provides example default bias conditions that can be used for program operations, erase operations, and soft-program operations for the NVM system 102. TABLE 1 also provides example bias voltage adjustments that can be made for different NVM operations when performance degradation has been detected. It is noted that other bias conditions in addition to or instead of those indicated below could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance after detection of a performance degradation condition for the NVM system 102.

TABLE 1

EXAMPLE DEFAULT BIAS CONDITIONS AND BIAS CONDITION ADJUSTMENTS FOR PROGRAM/ERASE OPERATIONS

| Operation | $V_D$ (volts) | $V_G$ (volts) | $V_S$ (volts) | $V_B$ (volts) | Bias Voltage Adjustments |
|---|---|---|---|---|---|
| Program | 4.2 | 8.5 | GND | GND | ±500 milli-volts for $V_G$ |
| Erase | float | −8.5 | float | 8.5 | ±500 milli-volts for $V_B$ |
| Soft-program | 4.2 | 3.0 | GND | GND | ±500 milli-volts for $V_G$ |

With respect to TABLE 1, it is noted that "±500 milli-volts" refers to an adjustment that can be in a range from zero to positive 500 milli-volts or from zero to negative 500 milli-volts, as desired. The magnitude and sign of a particular adjustment value can be selected, as desired, and different adjustments can be selected for different sets of bias conditions. It is also noted the "float" indicates nodes that are allowed to float during operation, such that they are not tied to a particular voltage level. Still further, it is noted that ground (GND), as set forth in the table below, can be configured to be zero volts.

Figure 4:
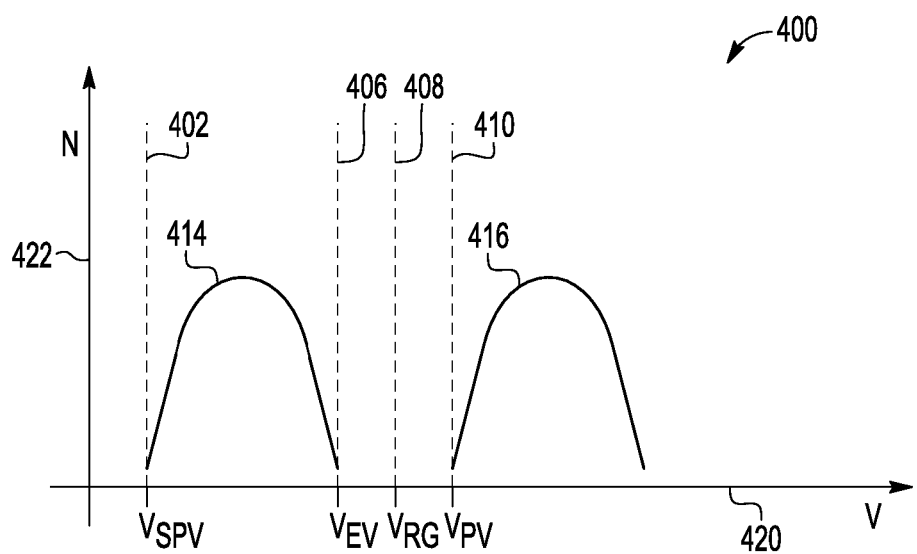
FIG. 4 is a probability distribution diagram for threshold voltages of NVM cells with respect to program and erase operations.

Performance degradation affects for the NVM cells 202 within the NVM system 102 are now discussed in more detail with respect to FIG. 4.

FIG. 4 is a probability distribution diagram 400 for the gate or threshold voltages of the NVM cells with respect to programming and erase operations. The x-axis 420 represents threshold voltage, and the y-axis 422 represents a probability distribution (N) of threshold voltage levels for NVM cells 202 within the NVM cell array 204. The voltage level 408 represents a read gate bias voltage ($V_{RG}$) applied during read operations. With respect to verification operations, the voltage level 402 represents a soft-program verify voltage ($V_{SPV}$) used during soft-program verification operations. The voltage level 406 represents an erase verify bias voltage ($V_{EV}$) used during erase verification operations. The voltage level 410 represents a program verify bias voltage ($V_{PV}$) used during program verification operations. Curve 414 represents a probability distribution for threshold voltages of erased cells within the NVM cell array 204. Curve 416 represents a probability curve for threshold voltages of programmed cells within the NVM cell array 204. For read operations, if the threshold voltage level of the accessed cell is above the read gate bias voltage ($V_{RG}$) 408, the NVM cell is determined to be programmed (e.g., logic 0). If the threshold voltage level of the accessed cell is below the read gate bias voltage ($V_{RG}$) 408, the NVM cell is determined to be erased (e.g., logic 1).

It is noted that FIG. 4 illustrates an example where two-level memory cells are utilized. Multi-level cells (MLCs) could also be used, such that there would be four or more distribution curves, depending upon the number of voltage levels utilized.

According to the embodiments described herein, it is recognized that temperature, cycle count, and/or other operational factors can affect the voltage probability distribution curves for the NVM cells. For example, the probability curves depicted in FIG. 4 will shift over time depending upon the operating temperature of the NVM system 102 and depending upon the number of times the NVM cells have been programmed and erased (i.e., cycle count). For example, after a given number of program pulses at a given operating temperature, the program distribution curve 416 will shift left for NVM cells with higher cycle count as compared to those with lower cycle count. Further, after a given number of erase pulses at a given operating temperature, the erase distribution curve 414 will shift right for NVM cells with higher cycle count compare with those with lower cycle count.

It is noted that one degradation affect caused by high cycle counts, as indicated above, is that program and erase operations can require additional time. For example, for a relatively young NVM system 102 (e.g., one that has a relatively low cycle count), an erase operation may require between 20-25 erase pulses before all erased NVM cells have threshold voltage lower than the erase verify voltage ($V_{EV}$) 406. For an aged NVM system 102 (e.g., one that has a relatively high cycle count), where the number of program/erase cycles has led to degraded performance, 32 or more erase pulses may be required before all erased NVM cells have a threshold voltage lower than the erase verify voltage ($V_{EV}$) 406. Similarly, for a relatively young NVM system 102, a program operation may require between 1-3 program pulses before all programmed NVM cells have a threshold voltage higher than the program verify voltage ($V_{PV}$) 416. For an aged NVM system 102, where the number of cycles has led to degraded performance, 5 or more program pulses may be required before all programmed NVM cells have a threshold voltage higher than the program verify voltage ($V_{PV}$) 416.

Advantageously, the embodiments described herein provide for adjustments to the program and/or erase operating bias conditions for the NVM cells 202 to reduce performance degradations that would otherwise occur, for example, from high cycling counts and/or from other factors.

Figure 6:
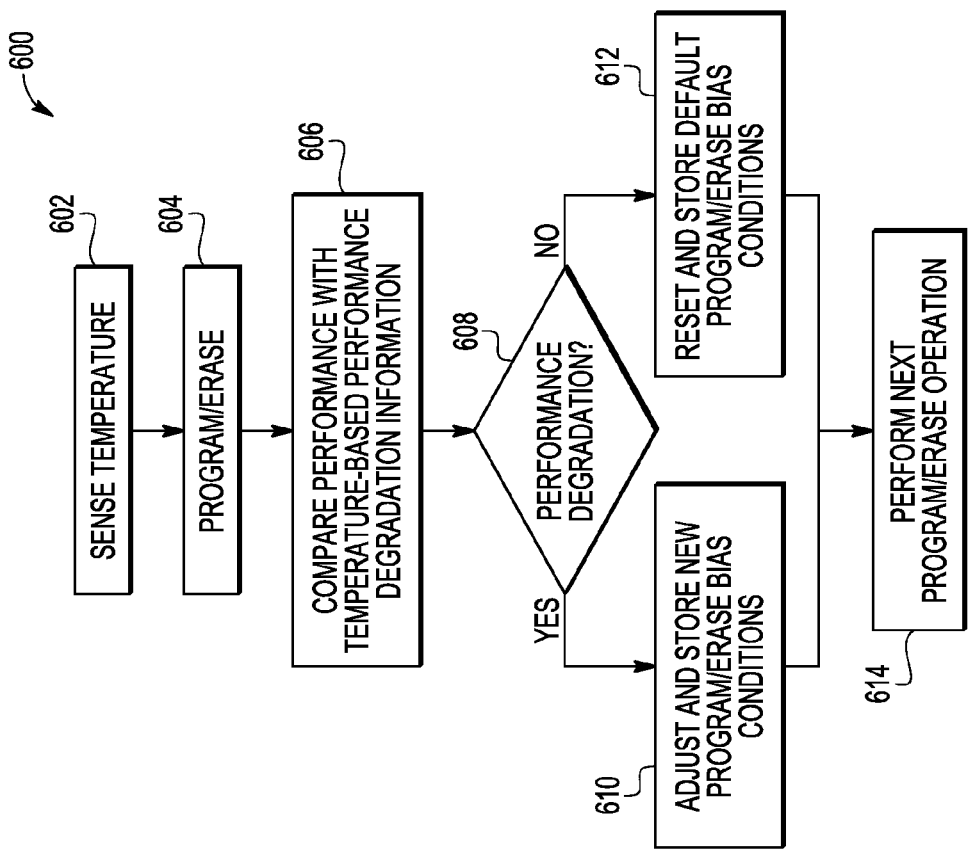
FIG. 6 is a flow diagram of an embodiment for adjusting program/erase bias conditions for NVM cells based upon temperature-based performance data for the NVM.
Figure 5:
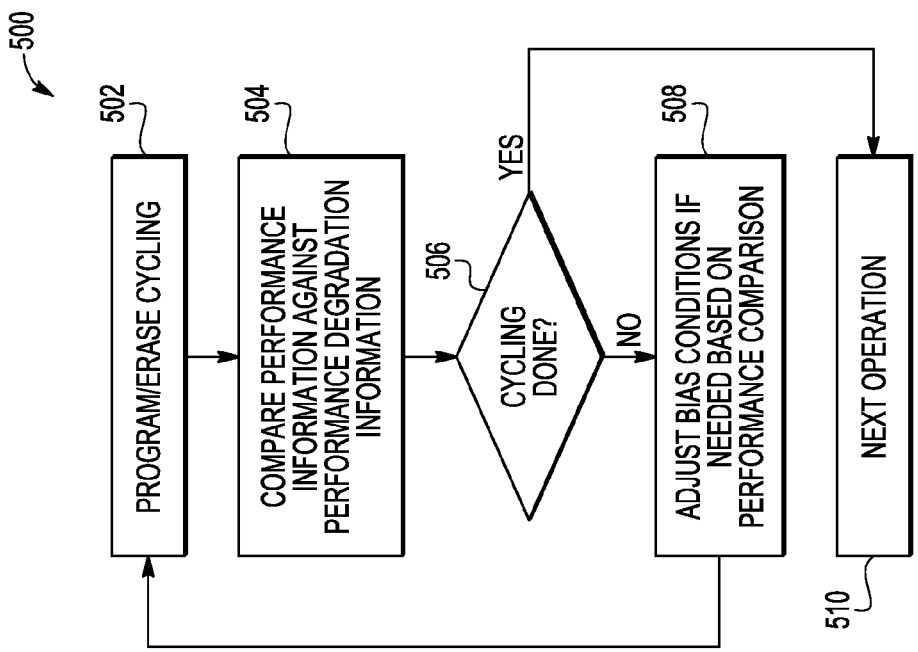
FIG. 5 is a flow diagram of an embodiment for adjusting program/erase bias conditions for NVM cells based upon performance data for the NVM.

Additional embodiments will now be described in more detail with respect to FIGS. 5-6 along with TABLE 2 below. In particular, FIG. 5 provides an embodiment that modifies NVM cell bias conditions for program and/or erase operations based upon performance degradation determinations. FIG. 6 provides an embodiment that modifies NVM cell bias conditions for program and/or erase operations based upon temperature-based performance degradation determinations. With respect to TABLE 2 below, it is further noted that bias conditions could also be adjusted for additional memory operations other than those set forth within TABLE 2, and other bias conditions in addition to or instead of those indicated below could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance after detection of a performance degradation condition for the NVM system 102.

FIG. 5 is a flow diagram of an embodiment 500 for adjusting operating conditions for the NVM based upon performance data for the NVM. By dynamically adjusting bias conditions for NVM cells based on performance data, such as program/erase cycling performance, program/erase pulse count, cycle count and/or other performance data, improved cycling performance during product lifetime is achieved, and product lifetime is extended as compared to prior solutions.

For the embodiment 500 depicted, a program/erase cycling operation is started in block 502. Next, in block 504 performance information for the NVM cells 202 is compared against performance degradation information. In block 506, a determination is made whether or not the program/erase cycling has completed. If YES, flow proceeds to block 510 where the next operation for the NVM system 102 is performed. If NO, flow proceeds to block 508 where bias conditions are adjusted, as needed, based upon the performance comparison. Flow then passes back to block 502, where the program/erase cycling operation continues.

As shown in embodiment 500, therefore, program/erase cycling performance of the last cycle is checked before the next cycling operation. For example, cycling performance information such as the number of program pulses required to program the NVM cells, the number of erase pulses required to erase the NVM cells, cycle count and/or other performance data can be used as performance information. If needed, adjustments are made to operating bias conditions based on cycling performance to achieve improved cycling performance. For example, where cycling performance has dropped (e.g., higher pulse counts required for erase or program), increases can be made to program bias voltages, erase bias voltages, and/or soft-program bias voltages for the next cycle. Similarly, with high cycle counts (e.g., cycle counts over about 45,000 cycles), increases can be made to program bias voltages, erase bias voltages, and/or soft-program bias voltages for the next cycle. By doing so, even where accumulated damage has occurred after high cycle count, cycling performance is improved through bias condition adjustments that improve program speed, tunneling erase speed, and soft-program speed.

FIG. 6 is a flow diagram of an embodiment 600 for adjusting program and/or erase operating bias conditions for the NVM based upon temperature-based performance data for the NVM.

In block 602, operating temperature is sensed for the NVM system 102. In block 604, a program and/or erase operation is performed for the NVM system 102. In block 606, performance of the NVM cells 202 is compared against a temperature-based performance degradation information. For example, performance information such as the number of program pulses required to program the NVM cells, the number of erase pulses required to erase the NVM cells, cycle count, and/or other performance data can be used as performance information. And this performance information can be compared against temperature-based performance degradation information that identifies temperature-based threshold levels where performance is considered to have degraded based. If needed, adjustments are made to operating bias conditions based on cycling performance to achieve improved cycling performance. In block 608, a determination is made whether performance degradation has occurred. If YES, the operation bias conditions for program and/or erase operations are adjusted and stored in block 610. If NO, the operation bias conditions are reset and default program/erase conditions are stored in block 612. From block 610 or from block 612, block 614 is then reached where the next program/erase operation is performed for the NVM system. It is noted that program/erase bias conditions can subsequently be reset and default conditions can be restored, if desired.

TABLE 2 below provides example adjustments that can be used to adjust the operating bias conditions for program, soft-program, and erase operations based upon performance measurements and comparisons, including those described with respect to FIGS. 5-6 above. For example, program/erase bias conditions can be stored as bias condition information 132 within the NVM system 102, and this program/erase bias condition information 132 can provide a plurality of sets of bias conditions to use for determined variations in performance. These program/erase bias conditions, for example, can be stored in the form of a look-up table, if desired, that identifies program/erase bias conditions or parameters to use depending upon the performance measurement. Further, this data can be updated, stored, and restored, as desired.

TABLE 2

EXAMPLE PROGRAM/ERASE BIAS CONDITION ADJUSTMENTS
TO REDUCE PERFORMANCE DEGRADATION

| Operation | $V_D$ (volts) | $V_G$ (volts) | $V_S$ (volts) | $V_B$ (volts) |
|---|---|---|---|---|
| Program | 4.2 | 8.5 plus increase up to 500 milli-volts | GND | GND |
| Soft-program | 4.2 | 3.0 plus increase up to 500 milli-volts | GND | GND |
| Erase | float | −8.5 | float | 8.5 plus increase up to 500 milli-volts |

As shown in TABLE 2, therefore, adjustments are made to program/erase cycling bias conditions based on performance degradation determinations. For example, where performance degradations have been detected, increases can be made to program bias voltages, erase bias voltages, and/or soft-program bias voltages for the next cycle.

Figure 7:
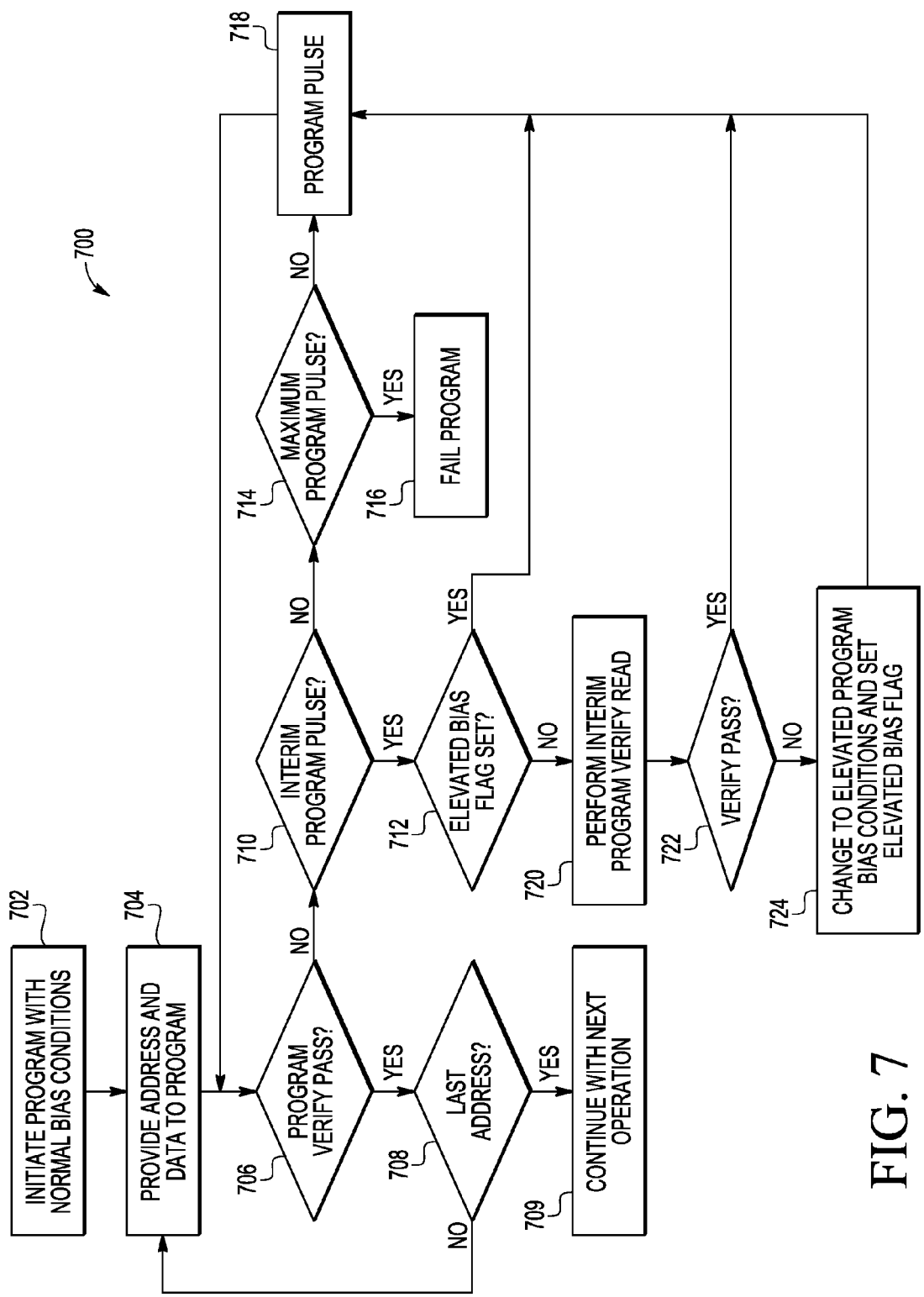
FIG. 7 is a flow diagram of an embodiment for adjusting program bias conditions based upon interim program verify performance data.
Figure 8:
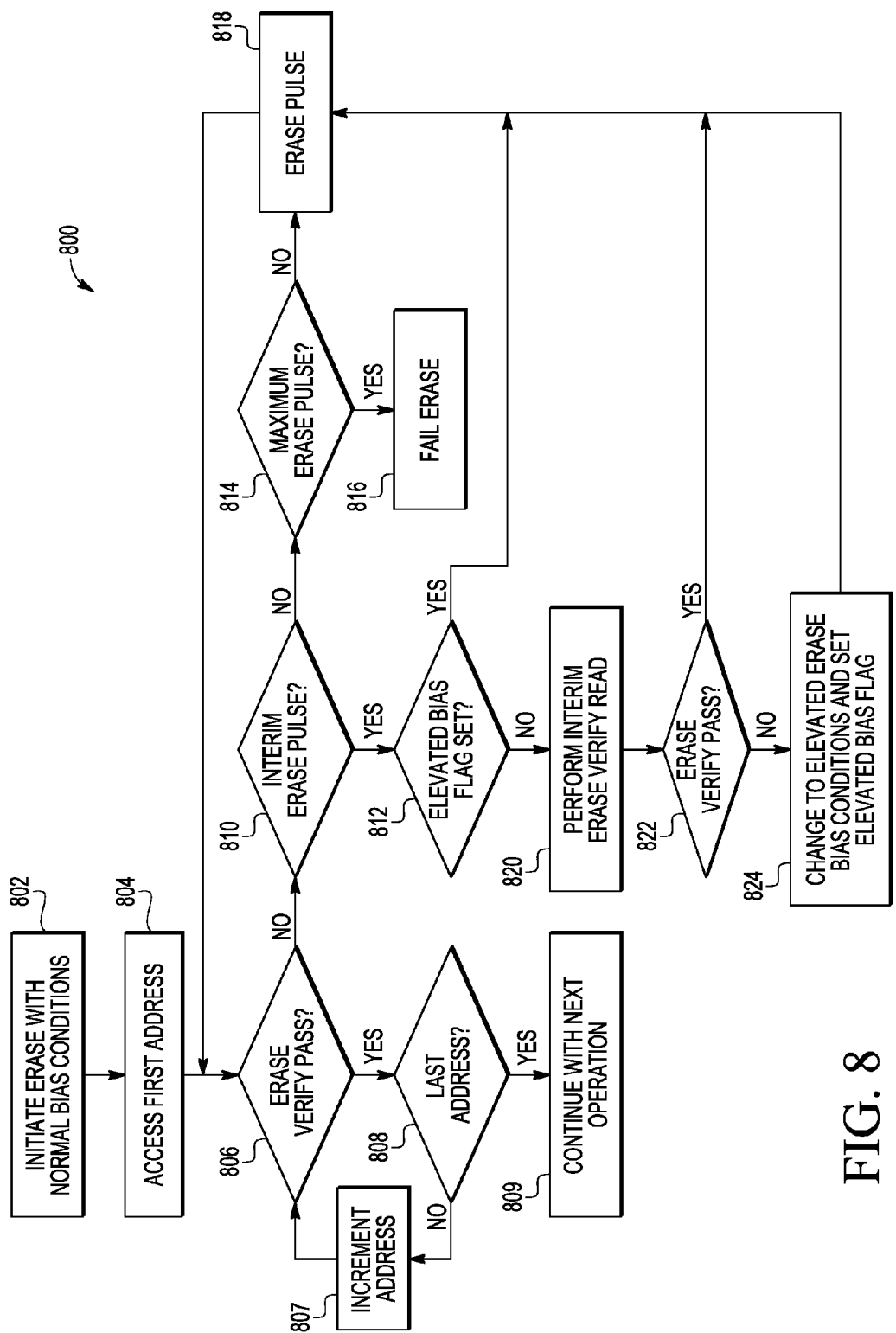
FIG. 8 is a flow diagram of an embodiment for adjusting erase bias conditions based upon interim erase verify performance data.

Looking now to FIGS. 7-8, additional embodiments will be described in more detail. In particular, FIGS. 7-8 provide example embodiments that utilize interim verify operations after a predetermined number of program/erase pulses during program and/or erase operations to determine whether performance degradation conditions exist for the NVM system. If performance has degraded as indicated by failing interim verify, bitcell voltage within the NVM cells 202 will tend to transition more slowly from an erase state to a program state during program operations (e.g., thereby requiring more program pulses to satisfy program verify) and from a program state to an erase state during erase operations (e.g., thereby requiring more erase pulses to satisfy erase verify). As described below, depending upon the results of these interim verify operations, bias conditions are adjusted for program and/or erase operations for the NVM system to improve performance and reduce the effects of performance degradation. It is further noted that for the interim program verify or erase verify operation, the interim program verify level or interim erase verify level is configured to be a predetermined voltage level between a normal (or default) program verify level and a normal (or default) erase verify level.

FIG. 7 is a flow diagram of an embodiment 700 for adjusting program (e.g., program, soft-program) bias conditions based upon interim program verify performance determinations. In block 702, a program operation for the NVM system is initiated with normal or default bias conditions. Next, in block 704, an address for the NVM array is provided for the program operation along with the data that is to be programmed into the NVM array. Flow then passes to determination block 706 where a determination is made whether or not the address being programmed passes the program verify operation (i.e., all the bits in the address have threshold voltage above the program verify level $V_{PV}$ 410). If YES, then flow passes to determination block 708 where a determination is made whether or not a last address for the program operation has been reached. If YES, the program operation completes successfully and then flow passes to block 709 where the next operation for the NVM system is performed. If NO, then flow passes back to block 704 where a new address is provided along with the data to be programmed for the program operation.

If the determination in block 706 is NO, then flow passes to determination block 710 where a determination is made whether or not the current program pulse is an interim program pulse (e.g., a predetermined number of program pulses less than the maximum pulse count for the program operation). If NO, then flow passes to block 714 where a determination is made whether the maximum program pulse count has been reached. If YES, flow passes to block 716 where the program operation is reported as a FAIL. If NO, then flow passes to block 718 where an additional program pulse is conducted. Flow then passes back to determination block 706.

If the determination in block 710 is YES, then flow passes to determination block 712 where a determination is made whether or not a flag has been set indicating that elevated program bias conditions have already been selected. If YES, then flow passes to determination block 718 where a program pulse operation is conducted. If NO, then flow passes to block 720 where an interim program verify read operation is performed on the address being programmed. Note that the interim program verify level is a predetermined voltage between the erase verify level ($V_{EV}$) 406 and program verify level ($V_{PV}$) 410. Flow then passes to determination block 722 where a determination is made whether or not this interim program verify read operation was a PASS (i.e., if all the bits in the address being programmed have threshold voltage above the predetermined interim program verify level, the interim program verify read operation passes). If YES, then flow passes to block 718 where a program pulse operation is conducted with the normal or default bias. If NO, then flow passes to block 724. In block 724, a set of elevated program bias conditions are selected, and the program bias conditions for the NVM system are changed to these elevated program bias conditions. The elevated program bias condition flag is also set to indicate that the elevated program bias conditions have been selected and applied. It is noted that the bias condition flag can be implemented, if desired, as one or more bits that are set in a register within the NVM system 102.

It is noted that elevated program bias voltages can be a higher gate voltage ($V_G$), as shown in TABLE 2. This higher gate voltage ($V_G$) can be, for example, 9.0 volts for program operations, 3.5 volts for soft-program operations, or some other higher gate voltage ($V_G$). The elevated program bias voltage can also be a higher drain voltage ($V_D$), such as 4.6 volts. Other voltage levels could also be used, if desired, and other bias voltages could also be adjusted, if desired. Further, multiple different elevated program bias levels could be used to further manage slow bitcell voltage movement. In other words, a first elevated voltage level could be used upon a first interim verify failure, and additional higher elevated voltage levels could be used upon subsequent interim verify failures. If multiple bias levels are used, additional blocks can be inserted in addition to determination block 710 for additional interim program pulse counts between determination block 710 and the maximum number of program pulse determination block 714.

As described with respect to FIG. 7, therefore, program bias voltages can be adaptively adjusted by monitoring the results of interim program verify operations conducted after one or more predetermined number of program pulses have occurred for a program operation. If the interim program verify read fails, the program bias voltages are adjusted to compensate for slow bitcell threshold voltage level movement during the program operation. These bias condition adjustments help to reduce performance degradation issues, such as those due to degraded bitcell movement that can be caused, for example, by charge trap-up during cycling and by other conditions such as process variations. For instance, for an NVM system that utilizes floating gates and tunneling oxides, the NVM cells with thicker tunneling oxide will likely move slower as the charges are harder to add to or remove from those NVM cells.

FIG. 8 is a flow diagram of an embodiment 800 for adjusting erase bias conditions based upon interim erase verify performance determinations. In block 802, an erase operation for the NVM system is initiated with normal or default bias conditions. Next, in block 804, the first address for the erase operation is accessed. Flow then passes to determination block 806 where a determination is made whether or not the address being accessed passes the erase verify operation (i.e., all the bits in the address have threshold voltage below the erase verify level $V_{EV}$ 406). If YES, then flow passes to determination block 808 where a determination is made whether or not a last address for the erase operation has been reached. If YES, the erase operation completes successfully and then flow passes to block 809 where the next operation for the NVM system is performed. If NO, then flow passes to block 807 where the erase address is incremented. Flow then passes back to determination block 806 to perform erase verify on the incremented address.

If the determination in block 806 is NO, then flow passes to determination block 810 where a determination is made whether or not the current erase pulse is an interim erase pulse (e.g., a predetermined number of erase pulses less than the maximum pulse count for the erase operation). If NO, then flow passes to block 814 where a determination is made whether the maximum erase pulse count has been reached. If YES, flow passes to block 816 where the erase operation is reported as a FAIL. If NO, then flow passes to block 818 where an additional erase pulse is conducted. Flow then passes back to determination block 806.

If the determination in block 810 is YES, then flow passes to determination block 812 where a determination is made whether or not a flag has been set indicating that elevated erase bias conditions have already been selected. If YES, then flow passes to determination block 818 where an additional erase pulse is conducted. If NO, then flow passes to block 820 where an interim erase verify read operation is performed on the address being accessed. Note that the interim erase verify level is a predetermined voltage between the erase verify level ($V_{EV}$) 406 and program verify level ($V_{PV}$) 410. Flow then passes to determination block 822 where a determination is made whether or not this interim erase verify read operation was a PASS (i.e., if all the bits in the address being accessed have threshold voltage below the predetermined interim erase verify level, the interim erase verify read operation passes). If YES, then flow passes to block 818 where an erase pulse operation is conducted with the normal or default bias. If NO, then flow passes to block 824. In block 824, a set of elevated erase bias conditions are selected, and the erase bias conditions for the NVM system are changed to these elevated erase bias conditions. The elevated erase bias condition flag is also set to indicate that the elevated erase bias conditions have been selected and applied. It is noted that the bias condition flag can be implemented, if desired, as one or more bits that are set in a register within the NVM system 102.

It is noted that elevated erase bias voltages can be, for example, a more negative gate voltage ($V_G$). For example, the more negative gate voltage ($V_G$) can be −9.0 volts. Further, the elevated erase bias voltage can be a higher P-well body voltage ($V_B$), such as 9.0 volts, as shown in TABLE 2. Other voltage levels could also be used, if desired, and other bias voltages could also be adjusted, if desired. Further, multiple different elevated erase bias levels could be used to further manage slow bitcell threshold voltage movement. In other words, a first elevated voltage level could be used upon a first interim verify failure, and additional higher elevated voltage levels could be used upon subsequent interim verify failures. If multiple erase bias levels are used, additional blocks can be inserted in addition to determination block 810 for additional interim erase pulse counts between block 810 and the maximum number of erase pulse determination block 814.

As described with respect to FIG. 8, therefore, erase bias voltages can be adaptively adjusted by monitoring the results of interim erase verify operations conducted after one or more predetermined number of erase pulses have occurred for an erase operation. If the interim erase verify read fails, the erase bias voltages are adjusted to compensate for slow bitcell threshold voltage level movement during the erase operation. These bias condition adjustments help to reduce performance degradation issues, such as those due to degraded bitcell movement that can be caused, for example, by charge trap-up during cycling and by other conditions such as process variations.

As indicated herein, a variety of embodiments can be implemented and different features and variations can be implemented, as desired.

In one system embodiment, an integrated non-volatile memory (NVM) system includes an array of non-volatile memory (NVM) cells, bias voltage generator circuitry configured to generate bias voltages for the NVM cells, controller circuitry configured to determine performance degradation for the NVM system based upon performance information relating to at least one of a program operation or an erase operation and to adjust at least one voltage level for the bias voltages generated by the bias voltage generator circuitry based upon the performance degradation determination. The controller circuitry is further configured to conduct at least one of a program operation or an erase operation for the NVM system using the at least one adjusted voltage level. In further embodiments, the performance information includes at least one of cycle count, program pulse count, or erase pulse count. Still further, the at least one adjusted voltage level can be a voltage level for a gate bias voltage, a body bias voltage, or a drain bias voltage, or a combination of these bias voltages.

In additional system embodiments, the at least one voltage level can include a voltage level for a gate bias voltage for a program operation. Still further, the program operation can be a soft-program operation. In addition, the gate bias voltage level can be increased by an amount less than or equal to 500 milli-volts. In further embodiments, the at least one voltage level can include a voltage level for a base bias voltage for an erase operation. In addition, the erase bias voltage level can be increased by an amount less than or equal to 500 milli-volts. In still further embodiments, the bias voltage generator circuitry can include at least two circuit blocks positioned in different locations on the integrated NVM system.

In further system embodiments, the system further includes storage circuitry configured to store sets of bias condition parameters, and the controller circuitry is configured to use at least one set of stored bias condition parameters to adjust the at least one voltage level. In other system embodiments, the system further includes storage circuitry configured to store performance degradation information, and the controller circuitry is configured to compare the performance information to stored performance degradation information to make the performance degradation determination. Still further, the stored performance degradation information can be temperature-based performance degradation information. The controller circuitry can be further configured to obtain operating temperature information for the NVM system. And the controller circuitry can be further configured to determine performance degradation by comparing the performance information to the temperature-based performance degradation information.

In still further system embodiments, the performance information includes results of an interim verify operation where the interim verify operation is conducted after a predetermined number of program or erase pulses and before a maximum number of program or erase pulses is reached. Still further, an interim verify level for the interim verify operation can be a voltage level between a default erase verify voltage level and a default program verify voltage level. In addition, the controller circuitry can be further configured to set a flag if the interim verify operation is a failure to indicate that a performance degradation condition exists for the NVM system. Still further, the performance information can include results of a plurality of interim verify operations where each interim verify operation is conducted after a predetermined number of program or erase pulses have occurred and before a maximum number of program or erase pulses is reached.

In one method embodiment, a method for operating an integrated non-volatile memory (NVM) system includes determining performance degradation based upon performance information relating to at least one of a program operation or an erase operation for an array of non-volatile memory (NVM) cells within an NVM system, adjusting at least one bias voltage generated by a bias voltage generator for the NVM cells based upon the performance degradation determination, and performing at least one of a program operation or an erase operation for the NVM system using the adjusted at least one bias voltage. Still further, the performance information for the determining step can include at least one of cycle count, program pulse count or erase pulse count.

In additional method embodiments, the method can further include obtaining operating temperature information for the NVM system, and the determining step can compare the performance information with temperature-based performance degradation information associated with at least one of program pulse counts, erase pulse counts, or cycle counts. Still further, the adjusting step can include increasing a voltage level for a gate bias voltage, and the performing step can include performing a program operation using the increased gate bias voltage level. In addition, the adjusting step can include increasing a voltage level for a base bias voltage, and the performing step can include performing an erase operation using the increased base bias voltage level.

In further method embodiments, the method can further include performing an interim verify operation during a program or erase operation after a predetermined number of program or erase pulses and before a maximum number of program or erase pulses is reached, and the performance information for the determining step can include results of the interim verify operation. Still further, the method can include performing a plurality of interim verify operations, and the performance information for the determining step can include results of the interim verify operations.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An integrated non-volatile memory (NVM) system, comprising:
    an array of non-volatile memory (NVM) cells;
    bias voltage generator circuitry configured to generate bias voltages for the NVM cells;
    controller circuitry configured to determine performance degradation for the NVM system based upon an interim verify operation relating to at least one of a program operation or an erase operation conducted after a predetermined number of program or erase pulses and before a maximum number of program or erase pulses is reached and to adjust at least one voltage level for the bias voltages generated by the bias voltage generator circuitry based upon results of the interim verify operation, the interim verify level for the interim verify operation being a voltage level between a default erase verify voltage level and a default program verify voltage level;
    wherein the controller circuitry is further configured to continue the at least one of a program operation or an erase operation for the NVM system using the at least one adjusted voltage level after the interim verify operation.

2. The integrated NVM system of claim 1, wherein the controller circuitry is further configured to obtain performance information for the NVM system, the performance information comprising at least one of cycle count, program pulse count, or erase pulse count.

3. The integrated NVM system of claim 1, wherein the at least one adjusted voltage level is a voltage level for a gate bias voltage, a body bias voltage, or a drain bias voltage, or a combination of these bias voltages.

4. The integrated NVM system of claim 1, wherein the at least one voltage level comprises a voltage level for a gate bias voltage for a program operation.

5. The integrated NVM system of claim 4, wherein the program operation comprises a soft-program operation.

6. The integrated NVM system of claim 4, wherein the gate bias voltage level is increased by an amount less than or equal to 500 milli-volts.

7. The integrated NVM system of claim 1, wherein the at least one voltage level comprises a voltage level for a body bias voltage for an erase operation.

8. The integrated NVM system of claim 7, wherein the erase bias voltage level is increased by an amount less than or equal to 500 milli-volts.

9. The integrated NVM system of claim 1, wherein the bias voltage generator circuitry comprises at least two circuit blocks positioned in different locations on the integrated NVM system.

10. The integrated NVM system of claim 1, further comprising storage circuitry configured to store sets of bias condition parameters, and wherein the controller circuitry is configured to use at least one set of stored bias condition parameters to adjust the at least one voltage level.

11. The integrated NVM system of claim 2, further comprising storage circuitry configured to store performance degradation information, and wherein the controller circuitry is configured to compare the performance information to stored performance degradation information to make a performance degradation determination.

12. The integrated NVM system of claim 11, wherein the stored performance degradation information is temperature-based performance degradation information, wherein the controller circuitry is further configured to obtain operating temperature information for the NVM system, and wherein the controller circuitry is further configured to determine performance degradation by comparing the performance information to the temperature-based performance degradation information.

13. The integrated NVM system of claim 1, wherein the controller circuitry is further configured to set a flag if the interim verify operation is a failure to indicate that a performance degradation condition exists for the NVM system.

14. The integrated NVM system of claim 1, wherein the performance information comprises results of a plurality of interim verify operations.

15. A method for operating an integrated non-volatile memory (NVM) system, comprising:
    performing an interim verify operation for an array of non-volatile memory (NVM) cells within an NVM system during a program or erase operation after a predetermined number of program or erase pulses and before a maximum number of program or erase pulses is reached, the interim verify level for the interim verify operation being a voltage level between a default erase verify voltage level and a default program verify voltage level,
    determining performance degradation based upon the interim verify operation;
    adjusting at least one bias voltage generated by a bias voltage generator for the NVM cells based upon the performance degradation determination; and
    performing at least one of a program operation or an erase operation for the NVM system using the adjusted at least one bias voltage.

16. The method of claim 15, further comprising obtaining performance information for the NVM system, wherein the performance information comprises at least one of cycle count, program pulse count or erase pulse count.

17. The method of claim 16, further comprising obtaining operating temperature information for the NVM system, and determining performance degradation for the NVM system using a comparison of the performance information with temperature-based performance degradation information associated with at least one of program pulse counts, erase pulse counts, or cycle counts.

18. The method of claim 15, wherein the adjusting step comprises increasing a voltage level for a gate bias voltage, and wherein a program operation is performed using the increased gate bias voltage level.

19. The method of claim 15, wherein the adjusting step comprises increasing a voltage level for a base bias voltage, and wherein an erase operation is performed using the increased body bias voltage level.

20. The method of claim 15, further comprising performing a plurality of interim verify operations.

* * * * *